(12) United States Patent
Cheng (10) Patent No.: US 10,678,106 B2
(45) Date of Patent: Jun. 9, 2020

(54) ARRAY SUBSTRATE, LIQUID CRYSTAL DISPLAY PANEL AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/535,643

(22) PCT Filed: Jan. 17, 2017

(86) PCT No.: PCT/CN2017/071417
§ 371 (c)(1),
(2) Date: Jun. 13, 2017

(87) PCT Pub. No.: WO2017/190533
PCT Pub. Date: Nov. 9, 2017

(65) Prior Publication Data
US 2018/0203272 A1   Jul. 19, 2018

(30) Foreign Application Priority Data

May 5, 2016   (CN) .................... 2016 2 0401036 U (51) Int. Cl.
*G02F 1/1368*   (2006.01)
*H01L 27/12*   (2006.01)
(Continued)

(52) U.S. Cl.
CPC ...... *G02F 1/1368* (2013.01); *G02F 1/134309* (2013.01); *G02F 1/136227* (2013.01);
(Continued)

(58) Field of Classification Search
CPC ............ G02F 1/1368; G02F 1/134309; G02F 1/136227; G02F 1/136286; G02F 2201/121; G02F 2201/123; H01L 27/124
See application file for complete search history.

(56) References Cited

U.S. PATENT DOCUMENTS 9,490,266 B2   11/2016   Wang et al.
2005/0255622 A1*   11/2005   Kokura ............ G02F 1/136227
                                                                438/30
(Continued)

FOREIGN PATENT DOCUMENTS

CN   103676367 A   3/2014
CN   104538413 A   4/2015
(Continued)

OTHER PUBLICATIONS

International Search Report of PCT/CN2017/071417 in Chinese, dated Mar. 28, 2017 with English translation.
(Continued)

*Primary Examiner* — Nathanael R Briggs
(74) *Attorney, Agent, or Firm* — Collard & Roe, P.C.

(57) ABSTRACT

An array substrate, a liquid crystal display panel and a display device are disclosed. The array substrate includes a first insulation layer disposed on a base substrate, a first conductive pattern disposed on the first insulation layer, a second insulation layer disposed on the first conductive pattern, a second conductive pattern disposed on the second insulation layer. The second conductive pattern is connected
(Continued)

to the first conductive pattern through a second via hole penetrating the second insulation layer. The array substrate further includes a first via hole exposing the first insulation layer and penetrating the first conductive pattern. An orthogonal projection of the first via hole on the base substrate and an orthogonal projection of the second via hole on the base substrate at least partially overlap with each other, the second conductive pattern is connected to the first insulation layer through the first via hole.

13 Claims, 3 Drawing Sheets

(51) Int. Cl.
*G02F 1/1362* (2006.01)
*G02F 1/1343* (2006.01)

(52) U.S. Cl.
CPC .. *G02F 1/136259* (2013.01); *G02F 1/136286* (2013.01); *H01L 27/124* (2013.01); *H01L 27/1244* (2013.01); *H01L 27/1248* (2013.01); *G02F 2001/136295* (2013.01); *G02F 2201/121* (2013.01); *G02F 2201/123* (2013.01)

(56) References Cited

U.S. PATENT DOCUMENTS

| | | | | |
|---|---|---|---|---|
| 2010/0073622 | A1* | 3/2010 | Ahn | G02F 1/133345 349/190 |
| 2010/0127961 | A1* | 5/2010 | Huh | G02F 1/136227 345/92 |
| 2012/0267631 | A1* | 10/2012 | Moon | G02F 1/136227 257/59 |
| 2015/0187894 | A1* | 7/2015 | Watanabe | G02F 1/136213 257/43 |
| 2015/0325706 | A1 | 11/2015 | Liu et al. | |

FOREIGN PATENT DOCUMENTS

| | | |
|---|---|---|
| CN | 105097833 A | 11/2015 |
| CN | 105355630 A | 2/2016 |
| CN | 105552024 A | 5/2016 |

OTHER PUBLICATIONS

Notice of Transmittal of the International Search Report of PCT/CN2017/071417 in Chinese, dated Mar. 28, 2017.
Written Opinion of the International Searching Authority of PCT/CN2017/071417 in Chinese, dated Mar. 28, 2017 with English translation.

* cited by examiner

ARRAY SUBSTRATE, LIQUID CRYSTAL DISPLAY PANEL AND DISPLAY DEVICE

CROSS REFERENCE TO RELATED APPLICATIONS

This application is the National Stage of PCT/CN2017/071417 filed on Jan. 17, 2017, which claims priority under 35 U.S.C. § 119 of Chinese Application No. 201620401036.5 filed on May 5, 2016, the disclosure of which is incorporated by reference.

FIELD OF THE ART

The present disclosure relates to the field of display technologies, more particularly, to an array substrate, a liquid crystal display panel and a display device.

BACKGROUND

Liquid crystal display technologies are widely used in televisions, mobile phones and public information display. A conventional liquid crystal display panel comprises a color filter substrate and an array substrate, a plurality of pixel regions are disposed on the array substrate, and a pixel electrode and a TFT are disposed inside each pixel region. The pixel electrode is connected to a drain electrode of the TFT through a pixel electrode via hole. The drain electrode of the TFT is typically made of a metal, and the pixel electrode is typically made of a transparent conductive material. As adhesion between the pixel electrode and the metal is relatively poor, there exists in the conventional array substrate a problem of the pixel electrode and the drain electrode of the TFT being easily detached at their connections, which will influence detect-free rate of the array substrate.

SUMMARY

The technical problem to be solved by the disclosure is to provide an array substrate, a liquid crystal display panel and a display device, which can solve the problem of the pixel electrode and the drain electrode of the TFT of the conventional array substrate being easily detached at their connections, thereby increasing the detect-free rate of the array substrate.

In first aspect of the disclosure, it is provided an array substrate, comprising a first insulation layer disposed on a base substrate, a first conductive pattern disposed on the first insulation layer, a second insulation layer disposed on the first conductive pattern, and a second conductive pattern disposed on the second insulation layer, the second conductive pattern being connected to the first conductive pattern through a second via hole penetrating the second insulation layer, the array substrate further comprising: a first via hole exposing the first insulation layer and penetrating the first conductive pattern, an orthogonal projection of the first via hole on the base substrate and an orthogonal projection of the second via hole on the base substrate at least partially overlapping with each other, the second conductive pattern being in contact with the first insulation layer through the first via hole.

In second aspect of the disclosure, it is provided a liquid crystal display panel, comprising the aforementioned array substrate.

In third aspect of the disclosure, it is provided a display device comprising the aforementioned liquid crystal display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the disclosure provide an array substrate, a liquid crystal display panel and a display device, which can solve the problem of the pixel electrode and the drain electrode of the TFT of the conventional array substrate being easily detached at their connections, thereby increasing the detect-free rate of the array substrate.

An embodiment of the disclosure provides an array substrate, which comprises a first insulation layer formed on a base substrate, a first conductive pattern on the first insulation layer, a second insulation layer on the first conductive pattern, a second conductive pattern on the second insulation layer. The second conductive pattern is connected to the first conductive pattern through a second via hole penetrating the second insulation layer. The array substrate further comprises a first via hole exposing the first insulation layer and penetrating the first conductive pattern, an orthogonal projection of the first via hole on the base substrate and an orthogonal projection of the second via hole on the base substrate at least partially overlap with each other, the second conductive pattern is in contact with the first insulation layer through the first via hole.

In the embodiment, the second conductive pattern is connected to the first conductive pattern through the second via hole; the second conductive pattern is further in contact with the first insulation layer through the first via hole at its connection with the first conductive pattern. On one hand, an electrical connection is realized between the second conductive pattern and the first conductive pattern. On the other hand, because a conductive material has good adhesion to the insulation layer, it makes it more difficult for the second conductive pattern to be peeled off from the first insulation layer, such that the second conductive pattern does not easily peel off from the first conductive pattern at their connections.

In at least some of embodiments, the first via hole further penetrates the first insulation layer to expose the base substrate, the second conductive pattern is further in contact with the base substrate through the first via hole. Because the base substrate is also of an insulating material, it makes it more difficult for the second conductive pattern to be peeled off from the base substrate, such that the second conductive pattern does not easily peel off from the first conductive pattern at their connections. When the first via hole penetrates the first insulation layer, the first via hole can still expose a part of the first insulation layer along a direction perpendicular to the plane of the base substrate. Thus, the second conductive pattern is in contact not only with the base substrate, through the first via hole, but also with this part of the first insulation layer, through the first via hole.

In at least some of embodiments, a cross section of the first via hole in a plane parallel to the base substrate has a shape of a circle, an ellipse, a square, a rectangle, a hexagon or an octagon; and a cross section of the second via hole in a plane parallel to the base substrate has a shape of a circle, an ellipse, a square, a rectangle, a hexagon or an octagon.

In at least some of embodiments, a cross section of the first via hole in a plane parallel to the base substrate has a shape of a circle, a cross section of the second via hole in a plane parallel to the base substrate has a shape of a circle, the orthogonal projection of the first via hole on the base substrate completely falls within the orthogonal projection of the second via hole on the base substrate.

In at least some of embodiments, a size of the first via hole in a first direction is smaller than a size of the second via hole in the first direction; a size of the first via hole in a second direction is larger than a size of the second via hole in the second direction, the first direction is perpendicular to the second direction.

In at least some of embodiments, a size of the first via hole in a second direction is smaller than a size of the second via hole in the second direction, a size of the first via hole in a first direction is larger than a size of the second via hole in the first direction, the first direction is perpendicular to the second direction.

In at least some of embodiments, a cross section of the first via hole in a plane parallel to the base substrate has a shape of an ellipse, a cross section of the second via hole in a plane parallel to the base substrate has a shape of an ellipse, a major axis of the first via hole is parallel to the second direction, and a major axis of the second via hole is parallel to the first direction. As an example, when both the first and second via holes have the shape of an ellipse in the plane parallel to the base substrate, an angle between the major axis of the first via hole and that of the second via hole may be 30° or 60°.

In at least some of embodiments, a cross section of the first via hole in a plane parallel to the base substrate has a shape of an ellipse, a cross section of the second via hole in a plane parallel to the base substrate has a shape of an ellipse, a major axis of the first via hole is parallel to the first direction, and a major axis of the second via hole is parallel to the second direction.

In at least some of embodiments, the first direction is an extension direction of a gate line, and the second direction is an extension direction of a data line.

In at least some of embodiments, the first conductive pattern is a drain electrode of a TFT, and the second conductive pattern is a pixel electrode.

In at least some of embodiments, the first insulation layer is a gate insulation layer and the second insulation layer is a passivation layer.

In at least some of embodiments, the first conductive pattern is a drain electrode of a TFT, the second conductive pattern is a pixel electrode, the first insulation layer is a gate insulation layer, the second insulation layer is a passivation layer, an active layer is disposed between the first conductive pattern and the first insulation layer, the first via hole also penetrates the active layer, in addition to the first conductive pattern.

In the following, embodiments of the disclosure will be further described with reference to an example of the first insulation layer being a gate insulation layer and the second insulation layer being a passivation layer.

Embodiment 1

Figure 1:
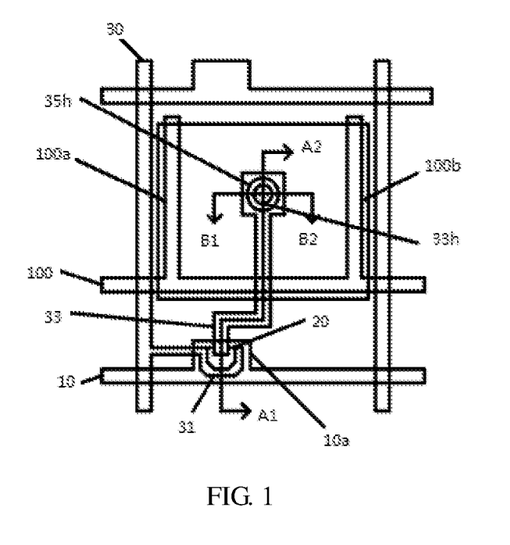
FIG. 1 schematically illustrates a plan view of an array substrate in accordance with an embodiment of the disclosure.
Figure 2:
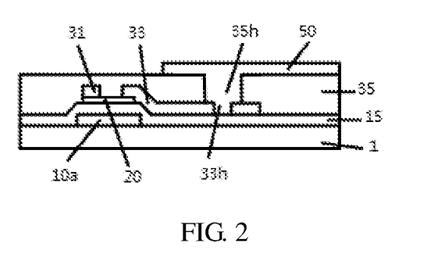
FIG. 2 is a cross section view taken along line A1A2 of FIG. 1.
Figure 5:
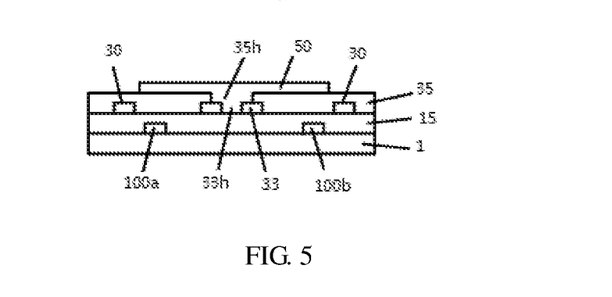
FIG. 5 is a cross section view taken along line B1B2 of FIGS. 1 and 3.

As illustrated in FIGS. 1, 2 and 5, an array substrate of the embodiment comprises: a gate electrode 10a, a gate line 10, a common electrode line 100, a first branch 100a of the common electrode line, a second branch 100b of the common electrode line 100, each of which are disposed on the base substrate 1; a gate insulation layer 15 (that is, the first insulation layer) overlaying each of the gate electrode 10a, the gate line 10, the common electrode line 100, the first branch 100a of the common electrode line, the second branch 100b of the common electrode line 100; an active layer 20, a data line 30, a source electrode 31, a drain electrode 33 (that is, the first conductive pattern), each of which is disposed on the gate insulation layer 15; a passivation layer 35 (that is, the second insulation layer) overlaying each of the active layer 20, the data line 30, the source electrode 31, and the drain electrode 33; a pixel electrode 50 (that is, the second conductive pattern) disposed on the passivation layer 35. The array substrate further comprises a passivation layer via hole 35h (that is, the second via hole) penetrating the passivation layer 35, and a drain electrode via hole 33h (the first via hole) penetrating the drain electrode 33. The passivation layer via hole 35h exposes the drain electrode 33, and the drain electrode via hole 33h exposes the gate insulation layer 15. An orthogonal projection of the drain electrode via hole 33h on the base substrate 1 at least partially overlaps with an orthogonal projection of the passivation layer via hole 35h on the base substrate 1, such that a part of the pixel electrode 50 (such as the part of pixel electrode 50 at a inner wall of the drain electrode via hole 33h) is kept in connection with the drain electrode 33, and another part of pixel electrode 50 (such as the part of pixel electrode 50 at the bottom of the drain electrode via hole 33h) is in contact with the gate insulation layer 15 through the passivation layer via hole 35h and the drain electrode via hole 33h. On one hand, an electrical connection is realized between the pixel electrode 50 and the drain electrode 33. On the other hand, because a conductive material has good adhesion to the insulation layer, it makes it more difficult for the pixel electrode 50 to be peeled off from the gate insulation layer 15, such that the pixel electrode 50 does not easily peel off from the drain electrode 33 at their connections.

Figure 6:
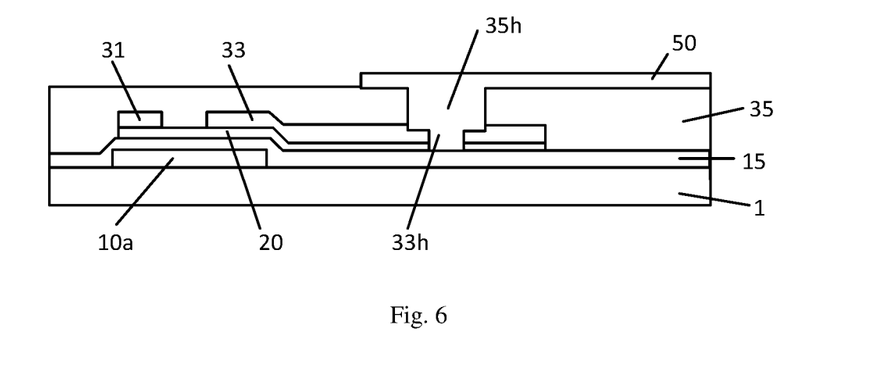
FIG. 6 is another cross section view of an array substrate in accordance with an embodiment of the disclosure.

In at least some of embodiments, the drain electrode via hole 33h further penetrates the gate insulation layer 15 to expose the base substrate 1, such that the pixel electrode 50 is in contact not only with the gate insulation layer 15 but also with the base substrate 1. Because the base substrate 1 is also of an insulating material, it also makes it more difficult for the pixel electrode 50 to be peeled off from the base substrate 1, making the connection between the pixel electrode 50 and the drain electrode 33 more secure. FIG. 6 is another cross section view of an array substrate in accordance with an embodiment of the disclosure. In at least some of embodiments, as illustrated in FIG. 6, an active layer 20 is disposed between the gate insulation layer 15 and the drain electrode 33. The first via hole 33h (drain electrode via hole 33h) further penetrates both the first conductive pattern 33 (the drain electrode 33) and the active layer 20, to expose the gate insulation layer 15. Alternatively, the drain electrode via hole 33h further penetrates both the active layer 20 and the gate insulation layer 15 to expose the base substrate 1.

In the embodiment, as illustrated in FIG. 1, both the drain electrode via hole 33h and the passivation layer via hole 35h have a shape of a circle. That is, a cross section of the first via hole (the drain electrode via hole 33h) in a plane parallel to the base substrate 1 has a shape of a circle, a cross section of the second via hole (the passivation layer via hole 35h) in a plane parallel to the base substrate 1 has a shape of a circle. A diameter of the passivation layer via hole 35h is larger than that of the drain electrode via hole 33h. The orthogonal projection of the drain electrode via hole 33h on the base substrate 1 completely falls within the orthogonal projection of the passivation layer via hole 35h on the base substrate 1. That is, the respective cross sections of the first and second via holes in the plane parallel to the base substrate 1 form concentric circles.

In at least some of embodiments, an active layer 20 is disposed between the gate insulation layer 15 and the drain electrode 33. The drain electrode via hole 33h further penetrates the active layer 20, to expose the gate insulation layer 15. Alternatively, the drain electrode via hole 33h further penetrates both the active layer 20 and the gate insulation layer 15 to expose the base substrate 1.

As an example, a method for fabricating the array substrate of the embodiment of the disclosure comprises the following steps:

Step 1: depositing a gate metal layer on the base substrate 1 by sputtering method, and forming patterns of a gate electrode 10a, a gate line 10, a common electrode line 100, a first branch 100a of the common electrode line, a second branch 100b of the common electrode line 100 through a patterning process. The gate metal layer is for example made of a metal material such as Cu, Al, Mo, Ti, Cr, W and the like, or an alloy of the above material. The gate metal layer may be a single-layer or multi-layer structure, such as Mo\Al\Mo, Ti\Cu\Ti, or Mo\Ti\Cu.

Step 2: depositing a gate insulation layer 15. The gate insulation layer 15 is for example made of at least one of silicon nitride and silicon oxide. The gate insulation layer 15 may be a single-layer or multi-layer structure, such as a silicon oxide\silicon nitride two-layer structure.

Step 3: depositing a semiconductor material and forming a pattern of an active layer 20 through a patterning process. As an example, the semiconductor material is for example amorphous silicon, polysilicon, microcrystalline silicon, or oxide semiconductor. As an example, a film formation method such as Plasma Enhanced Chemical Vapor Deposition (PECVD) is for example used to sequentially deposit a-Si and n+a-Si, or IGZO is deposited through sputtering method. Then the patterning process is used to form the pattern of the active layer 20.

Step 4: depositing a S/D metal layer by sputtering method, and forming patterns of a data line 30, a source electrode 31, a drain electrode 33 through a patterning process, wherein the a drain electrode 33 comprises a drain electrode via hole 33h. The S/D metal layer is for example made of a metal material such as Cu, Al, Mo, Ti, Cr, W and the like, or an alloy of the above material. The S/D metal layer may be a single-layer or multi-layer structure, such as Mo\Al\Mo, Ti\Cu\Ti, or Mo\Ti\Cu.

Step 5: depositing a passivation layer 35, and forming a passivation layer via hole 35h exposing the drain electrode 33 through a patterning process. The passivation layer 35 is made of for example an inorganic material such as silicon nitride, or an organic insulating material, such as organic resin. The passivation layer 35 may be a single-layer or multi-layer structure, such as a multi-layer structure including multiple inorganic material layers, or a multi-layer structure including an inorganic material layer and an organic material layer. For example, PECVD is used to deposit silicon nitride, then the passivation layer via hole 35h exposing the drain electrode 33 is formed through the patterning process.

Step 6: depositing a transparent conductive material layer such as ITO, and forming a pattern of a pixel electrode 50 through a patterning process. The pixel electrode 50 is in contact with the gate insulation layer 15 through the passivation layer via hole 35h and the drain electrode via hole 33h. The pixel electrode 50 may also be of other transparent conductive material such as IZO.

Embodiment 2

Figure 3:
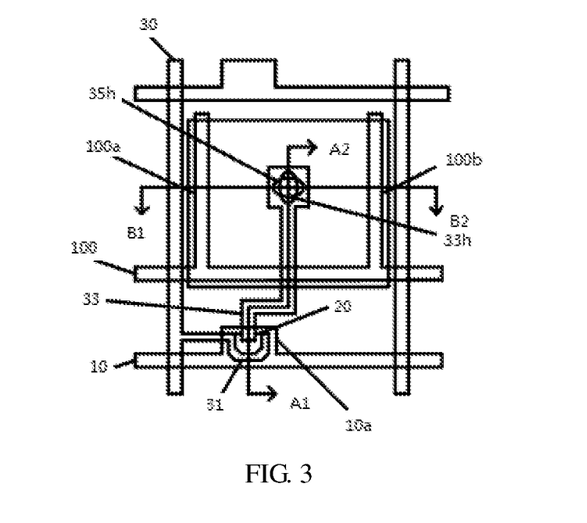
FIG. 3 schematically illustrates a plan view of another array substrate in accordance with an embodiment of the disclosure.
Figure 4:
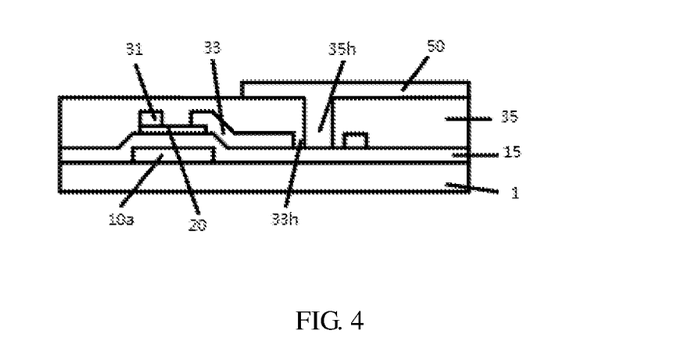
FIG. 4 is a cross section view taken along line A1A2 of FIG. 3.

As illustrated in FIGS. 3, 4 and 5, an array substrate of the disclosure comprises: a gate electrode 10a, a gate line 10, a common electrode line 100, a first branch 100a of the common electrode line, a second branch 100b of the common electrode line 100, each of which is disposed on the base substrate 1; a gate insulation layer 15 (that is, the first insulation layer) overlaying each of the gate electrode 10a, the gate line 10, the common electrode line 100, the first branch 100a of the common electrode line, the second branch 100b of the common electrode line 100; an active layer 20, a data line 30, a source electrode 31, a drain electrode 33 (that is, the first conductive pattern), each of which is disposed on the gate insulation layer 15; a passivation layer 35 (that is, the second insulation layer) overlaying each of the active layer 20, the data line 30, the source electrode 31, and the drain electrode 33; a pixel electrode 50 (that is, the second conductive pattern) disposed on the passivation layer 35. The array substrate further comprises a passivation layer via hole 35h (that is, the second via hole) penetrating the passivation layer 35, a drain electrode via hole 33h (the first via hole) penetrating the drain electrode 33. The passivation layer via hole 35h exposes the drain electrode 33, and the drain electrode via hole 33h exposes the gate insulation layer 15. An orthogonal projection of the drain electrode via hole 33h on the base substrate 1 at least partially overlaps with an orthogonal projection of the passivation layer via hole 35h on the base substrate 1, such that a part of the pixel electrode 50 is kept in connection with the drain electrode 33, and another part of pixel electrode 50 is in contact with the gate insulation layer 15 through the passivation layer via hole 35h and the drain electrode via hole 33h. On one hand, an electrical connection is realized between the pixel electrode 50 and the drain electrode 33. On the other hand, because a conductive material has good adhesion to the insulation layer, it makes it more difficult for the pixel electrode 50 to be peeled off from the gate insulation layer 15, such that the pixel electrode 50 does not easily peel off from the drain electrode 33 at their connections.

In at least some of embodiments, the drain electrode via hole 33h further penetrates the gate insulation layer 15 to expose the base substrate 1, such that the pixel electrode 50 is in contact not only with the gate insulation layer 15 but also with the base substrate 1. Because the base substrate 1 is also of an insulating material, it also makes it more difficult for the pixel electrode 50 to be peeled off from the base substrate 1, making the connection between the pixel electrode 50 and the drain electrode 33 more secure.

As an example, a size of the first via hole (the drain electrode via hole 33h) in a first direction is smaller than a size of the second via (the passivation layer via hole 35h) hole in the first direction; a size of the first via hole (the drain electrode via hole 33h) in a second direction is larger than a size of the second via hole (the passivation layer via hole 35h) in the second direction, the first direction is perpendicular to the second direction.

Alternatively, a size of the first via hole (the drain electrode via hole 33h) in a second direction is smaller than a size of the second via (the passivation layer via hole 35h) hole in the second direction; a size of the first via hole (the drain electrode via hole 33h) in a first direction is larger than a size of the second via hole (the passivation layer via hole 35h) in the first direction, the first direction is perpendicular to the second direction.

As an example, an included angle between the first direction and the extension direction of the gate line is 0°, 30° or 60°. In the embodiment, the first direction is the extension direction of the gate line, and the second direction is the extension direction of the data line.

In the embodiment, as illustrated in FIG. 3, both the drain electrode via hole 33h and the passivation layer via hole 35h have a shape of an ellipse. That is, a cross section of the first via hole in a plane parallel to the base substrate 1 (the drain electrode via hole 33h) has a shape of an ellipse, a cross section of the second via hole in a plane parallel to the base substrate 1 (the passivation layer via hole 35h) has a shape of an ellipse. A major axis of the passivation layer via hole 35h is perpendicular to that of the drain electrode via hole 33h. It can be contemplated that an angle between the major axis of the passivation layer via hole 35h and that of the drain electrode via hole 33h is not limited to 90°. Instead, it may be an arbitrary angle, such as 30°, 60°, 120°, 150° and the like.

For example, as illustrated in FIGS. 3, 4 and 5, the major axis of the drain electrode via hole 33h is parallel to the second direction, and the major axis of the passivation layer via hole 35h is parallel to the first direction. A size of the drain electrode via hole 33h in the first direction is smaller than that of the passivation layer via hole 35h in the first direction; and a size of the drain electrode via hole 33h in the second direction is larger than that of the passivation layer via hole 35h in the second direction.

Alternatively, the major axis of the drain electrode via hole 33h is parallel to the first direction, and the major axis of the passivation layer via hole 35h is parallel to the second direction. A size of the drain electrode via hole 33h in the first direction is larger than that of the passivation layer via hole 35h in the first direction; and a size of the drain electrode via hole 33h in the second direction is smaller than that of the passivation layer via hole 35h in the second direction.

In at least some of embodiments, an active layer 20 is disposed between the gate insulation layer 15 and the drain electrode 33. The drain electrode via hole 33h further penetrates the active layer 20, to expose the gate insulation layer 15. Alternatively, the drain electrode via hole 33h further penetrates both the active layer 20 and the gate insulation layer 15 to expose the base substrate 1.

As an example, a method for fabricating the array substrate of the embodiment of the disclosure comprises the following steps:

Step 1: depositing a gate metal layer on the base substrate 1 by sputtering method, and forming patterns of a gate electrode 10a, a gate line 10, a common electrode line 100, a first branch 100a of the common electrode line, a second branch 100b of the common electrode line 100 through a patterning process. The gate metal layer is for example made of a metal material such as Cu, Al, Mo, Ti, Cr, W and the like, or an alloy of the above material. The gate metal layer may be a single-layer or multi-layer structure, such as Mo\Al\Mo, Ti\Cu\Ti, or Mo\Ti\Cu.

Step 2: depositing a gate insulation layer 15. The gate insulation layer 15 is for example made of at least one of silicon nitride and silicon oxide. The gate insulation layer 15 may be a single-layer or multi-layer structure, such as a silicon oxide\silicon nitride two-layer structure.

Step 3: depositing a semiconductor material and forming a pattern of an active layer 20 through a patterning process. The semiconductor material is for example amorphous silicon, polysilicon, microcrystalline silicon, or oxide semiconductor. As an example, a film formation method such as Plasma Enhanced Chemical Vapor Deposition (PECVD) is for example used to sequentially deposit a-Si and n+a-Si, or IGZO is deposited through sputtering method. Then the patterning process is used to form the pattern of the active layer 20 pattern.

Step 4: depositing a S/D metal layer by sputtering method, and forming patterns of a data line 30, a source electrode 31, a drain electrode 33 through a patterning process, wherein the a drain electrode 33 comprises a drain electrode via hole 33h. The S/D metal layer is for example made of a metal material such as Cu, Al, Mo, Ti, Cr, W and the like, or an alloy of the above material. The S/D metal layer may be a single-layer or multi-layer structure, such as Mo\Al\Mo, Ti\Cu\Ti, or Mo\Ti\Cu.

Step 5: depositing a passivation layer 35, and forming a passivation layer via hole 35h exposing the drain electrode 33 through a patterning process. The passivation layer 35 is made of for example an inorganic material such as silicon nitride, or an organic insulating material, such as organic resin. The passivation layer 35 may be a single-layer or multi-layer structure, such as a multi-layer structure including multiple inorganic material layers, or a multi-layer structure including an inorganic material layer and an organic material layer. For example, PECVD is used to deposit silicon nitride, then the passivation layer via hole 35h exposing the drain electrode 33 is formed through the patterning process.

Step 6: depositing a transparent conductive material layer such as ITO, and forming a pattern of a pixel electrode 50 through a patterning process. The pixel electrode 50 is in contact with the gate insulation layer 15 through the passivation layer via hole 35h and the drain electrode via hole 33h. The pixel electrode 50 may also be of other transparent conductive material such as IZO.

An embodiment of the disclosure further provides a LCD panel, which comprises the array substrate of any of the above embodiments.

An embodiment of the disclosure further provides a display device, which comprises the above liquid crystal panel. The display device may be a liquid crystal panel, a liquid crystal television, a liquid crystal display, a digital photoframe, a mobile phone, a tablet PC, a navigator, an e-paper and any product or component having a display function.

What is described above is related to the illustrative embodiments of the disclosure only and not limitative to the scope of the disclosure; the scopes of the disclosure are defined by the accompanying claims.

The present application claims priority of Chinese Application No. 201620401036.5, filed on May 5, 2016, the disclosure of which is incorporated herein by reference in its entirety.

What is claimed is:

1. An array substrate, comprising a first insulation layer disposed on a base substrate, a first conductive pattern disposed on the first insulation layer, a second insulation layer disposed on the first conductive pattern, and a second conductive pattern disposed on the second insulation layer, the second conductive pattern being connected to the first conductive pattern through a second via hole penetrating only the second insulation layer, the array substrate further comprising:
a first via hole exposing the first insulation layer and penetrating only the first conductive pattern but not reaching in the first insulation layer, an orthogonal projection of the first via hole on the base substrate and an orthogonal projection of the second via hole on the base substrate at least partially overlapping with each other, the second conductive pattern being in contact with a top surface of the first insulation layer through the first via hole;
wherein a size of the first via hole in a first direction is smaller than a size of the second via hole in the first direction, a size of the first via hole in a second direction is lamer than a size of the second via hole in the second direction, the first direction is perpendicular to the second direction, the first direction is an extension direction of a gate line, the second direction is an extension direction of a data line, and
wherein the second via hole penetrates only the second insulation layer and exposes a top surface of the first conductive pattern away from the base substrate.

2. The array substrate of claim 1, wherein a cross section of the first via hole in a plane parallel to the base substrate has a shape of an ellipse, a rectangle, a hexagon or an octagon; and
a cross section of the second via hole in a plane parallel to the base substrate has a shape of an ellipse, a rectangle, a hexagon or an octagon.

3. The array substrate of claim 1, wherein a cross section of the first via hole in a plane parallel to the base substrate has a shape of an ellipse, a cross section of the second via hole in a plane parallel to the base substrate has a shape of an ellipse, a major axis of the first via hole is parallel to the second direction, and a major axis of the second via hole is parallel to the first direction.

4. The array substrate of claim 1, wherein the first conductive pattern is a drain electrode of a TFT, and the second conductive pattern is a pixel electrode.

5. The array substrate of claim 4, wherein the first insulation layer is a gate insulation layer and the second insulation layer is a passivation layer.

6. A liquid crystal display panel, comprising the array substrate of claim 1.

7. A display device comprising the liquid crystal display panel of claim 6.

8. An array substrate, comprising a first insulation layer disposed on a base substrate, a first conductive pattern disposed on the first insulation layer, a second insulation layer disposed on the first conductive pattern, and a second conductive pattern disposed on the second insulation layer, the second conductive pattern being connected to the first conductive pattern through a second via hole penetrating only the second insulation layer, the array substrate further comprising:
a first via hole exposing the first insulation layer and penetrating only the first conductive pattern but not reaching in the first insulation layer, an orthogonal projection of the first via hole on the base substrate and an orthogonal projection of the second via hole on the base substrate at least partially overlapping with each other, the second conductive pattern being in contact with a top surface of the first insulation layer through the first via hole; and
wherein the second via hole penetrates only the second insulation layer and exposes a top surface of the first conductive pattern away from the base substrate.

9. The array substrate of claim 8, wherein a cross section of the first via hole in a plane parallel to the base substrate has a shape of a circle, an ellipse, a square, a rectangle, a hexagon or an octagon; and
a cross section of the second via hole in a plane parallel to the base substrate has a shape of a circle, an ellipse, a square, a rectangle, a hexagon or an octagon.

10. The array substrate of claim 8, wherein a cross section of the first via hole in a plane parallel to the base substrate has a shape of a circle, a cross section of the second via hole in a plane parallel to the base substrate has a shape of a circle, the orthogonal projection of the first via hole on the base substrate completely falls within the orthogonal projection of the second via hole on the base substrate.

11. The array substrate of claim 8, wherein a size of the first via hole in a second direction is smaller than a size of the second via hole in the second direction, a size of the first via hole in a first direction is larger than a size of the second via hole in the first direction, the first direction is perpendicular to the second direction.

12. The array substrate of claim 11, a cross section of the first via hole in a plane parallel to the base substrate has a shape of an ellipse, a cross section of the second via hole in a plane parallel to the base substrate has a shape of an ellipse, a major axis of the first via hole is parallel to the second direction, and a major axis of the second via hole is parallel to the first direction.

13. The array substrate of claim 12, the first direction is an extension direction of a gate line, and the second direction is an extension direction of a data line.

* * * * *